(12) United States Patent
Cho et al.

(10) Patent No.: US 8,981,358 B2
(45) Date of Patent: Mar. 17, 2015

(54) ORGANIC INSULATING LAYER COMPOSITION, METHOD OF FORMING ORGANIC INSULATING LAYER, AND ORGANIC THIN FILM TRANSISTOR INCLUDING THE ORGANIC INSULATING LAYER

(71) Applicants: Joon-Hyuk Cho, Yongin (KR); Yong-Young Noh, Daejeon (KR); Kang-Jun Baeg, Yongban-ri (KR)

(72) Inventors: Joon-Hyuk Cho, Yongin (KR); Yong-Young Noh, Daejeon (KR); Kang-Jun Baeg, Yongban-ri (KR)

(73) Assignees: Samsung Display Co., Ltd., Yongin, Gyeonggi-Do (KR); Hanbat National University Industry-Academic Cooperation Foundation, Daejeon (KR)

( * ) Notice: Subject to any disclaimer, the term of this patent is extended or adjusted under 35 U.S.C. 154(b) by 0 days.

(21) Appl. No.: 13/926,156

(22) Filed: Jun. 25, 2013

(65) Prior Publication Data
US 2014/0001453 A1 Jan. 2, 2014

(30) Foreign Application Priority Data
Jun. 27, 2012 (KR) .......................... 10-2012-0069478

(51) Int. Cl.
*H01L 35/24* (2006.01)
*H01L 51/05* (2006.01)

(52) U.S. Cl.
CPC ........... *H01L 51/052* (2013.01); *H01L 51/0541* (2013.01)
USPC ..................................... 257/40; 257/E51.001

(58) Field of Classification Search
USPC ............................................. 257/40, E51.001
See application file for complete search history.

(56) References Cited

U.S. PATENT DOCUMENTS

| 8,198,625 B2 | 6/2012 | Yoon et al. |
| 2006/0214154 A1 | 9/2006 | Yang et al. |

FOREIGN PATENT DOCUMENTS

| KR | 10-2007-0122203 A | 12/2007 |
| KR | 10-2010-0046641 A | 5/2010 |
| KR | 10-2010-0107799 A | 10/2010 |
| KR | 10-2010-0138078 A | 12/2010 |
| KR | 10-2011-0042479 A | 4/2011 |
| KR | 10-2011-0098297 A | 9/2011 |

*Primary Examiner* — Anthony Ho
(74) *Attorney, Agent, or Firm* — Lee & Morse, P.C.

(57) ABSTRACT

An organic insulating layer composition includes a polymer mixture including 50 parts to 90 parts by volume of an organic polymer and 10 parts to 50 parts by volume of an amorphous polymer, wherein the organic polymer includes at least a first repeating unit and a second repeating unit, the first and second repeating units each being substituted with at least one of fluorine or chlorine, a total number of fluorine and chlorine atoms in the first repeating unit being different from a total number of fluorine and chlorine atoms in the second repeating unit, and an organic solvent.

25 Claims, 20 Drawing Sheets

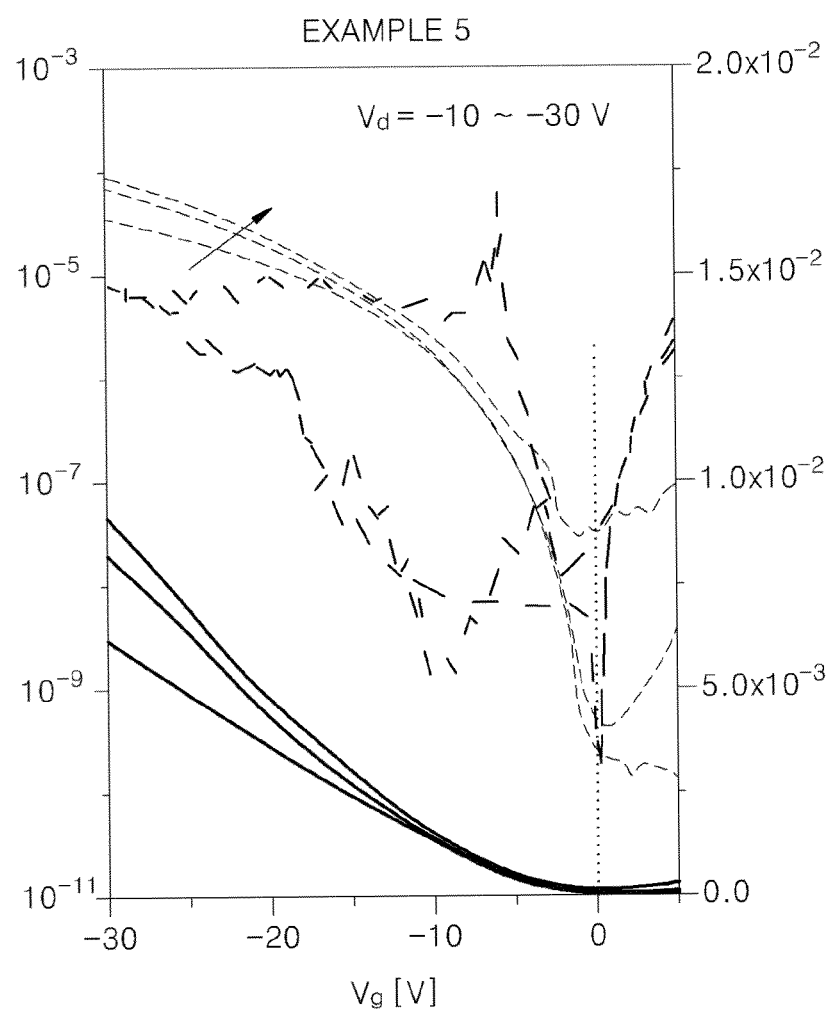

ORGANIC INSULATING LAYER COMPOSITION, METHOD OF FORMING ORGANIC INSULATING LAYER, AND ORGANIC THIN FILM TRANSISTOR INCLUDING THE ORGANIC INSULATING LAYER

CROSS-REFERENCE TO RELATED APPLICATION

This application claims the benefit of and priority under 35 U.S.C. §119 to Korean Patent Application No. 10-2012-0069478, filed on Jun. 27, 2012, in the Korean Intellectual Property Office, and entitled: "ORGANIC INSULATING LAYER COMPOSITION, METHOD OF FORMING ORGANIC INSULATING LAYER, AND ORGANIC THIN FILM TRANSISTOR INCLUDING THE ORGANIC INSULATING LAYER," which is incorporated by reference herein in its entirety.

BACKGROUND

1. Field

Embodiments relate to an organic insulating layer composition, a method of forming an organic insulating layer, and an organic thin film transistor (OTFT) including the organic insulating layer

2. Description of the Related Art

Recently, flexible displays have received great interest. Since people want a portable and relatively large screen, the development of a rollable display that allows folding or bending of a screen has been considered.

SUMMARY

Embodiments are directed to an organic insulating layer composition, including a polymer mixture including 50 parts to 90 parts by volume of an organic polymer and 10 parts to 50 parts by volume of an amorphous polymer, wherein the organic polymer includes at least a first repeating unit and a second repeating unit, the first and second repeating units each being substituted with at least one of fluorine or chlorine, a total number of fluorine and chlorine atoms in the first repeating unit being different from a total number of fluorine and chlorine atoms in the second repeating unit, and an organic solvent.

The organic polymer may include at least one selected from poly(vinylidene fluoride-trifluoroethylene), poly(vinylidene fluoride-trifluoroethylene-chlorofluoroethylene), poly(vinylidene fluoride-trifluoroethylene-chlorodifluoroethylene), poly(vinylidene fluoride-trifluoroethylene-chlorotrifluoroethylene), and poly(vinylidene fluoride-trifluoroethylene-hexafluoropropylene).

A number average molecular weight of the organic polymer may be 5,000 to 1,000,000.

The organic polymer may be poly(vinylidene fluoride-trifluoroethylene).

A polymer weight ratio of vinylidene fluoride and trifluoroethylene of the organic polymer may be 55:45 to 95:5.

The amorphous polymer may include at least one selected from polymethyl methacrylate, polystyrene, polyvinylpyrrolidone, and polyimide.

A number average molecular weight of the amorphous polymer may be 10,000 to 1,000,000.

The organic solvent may include at least one selected from dimethyl sulfoxide, methyl ethyl ketone, acetonitrile, and 1-butanone.

Embodiments are also directed to a method of forming an organic insulating layer, the method including coating a top of an organic semiconductor layer or a gate electrode with the organic insulating layer composition according to an embodiment to form a coating layer, and heat-treating the coating layer formed by the coating.

The coating may be performed by using a spin coating method, a deep coating method, a printing method, or an inkjet or roll coating method.

The heat-treating may be performed at a temperature of 150° C. or less.

The coating may be performed by using a spin coating method, and the heat-treating may be performed at a temperature of 70° C. to 100° C. for 1 to 3 hours.

The coating may include coating the top of the organic semiconductor layer with a first organic insulating layer composition to prepare a coating layer, removing a portion of the coating layer from a top of a p-type organic semiconductor layer, and coating the top of the p-type organic semiconductor layer with a second organic insulating layer composition, wherein the second organic insulating layer composition is the organic insulating layer composition according to an embodiment.

The removing of the portion of the coating layer may be performed by using an inkjet printing method of a solvent.

Embodiments are also directed to an organic insulating layer formed by using the method according to an embodiment.

A thickness of the organic insulating layer may be 100 nm to 400 nm.

Embodiments are also directed to an organic thin film transistor (OTFT), including a substrate, source/drain electrodes, an organic semiconductor layer, the organic insulating layer according to an embodiment, and a gate electrode.

The substrate may include at least one selected from glass, silicon, polyethersulphone, polyacrylate, polyetherimide, polyethylene naphthalate, polyethylene terephthalate, polyphenylene sulfide, polyallylate, polyimide, polycarbonate, cellulose triacetate, cellulose acetate propionate, and a metal foil.

The source/drain electrodes may include at least one selected from gold, silver, molybdenum, copper, and indium tin oxide.

The organic semiconductor layer may include at least one selected from polythiophene, thienothiophene, triisopropylsilyl pentacene, pentacene precursor, alpha-6-thiophene, polyfluorene, pentacene, tetracene, anthracene, perylene, rubrene, coronene, perylene tetracarboxylic diimide, poly-paraphenylene vinylene, polythiophene vinylene, polythienylenevinylene, oligothiophene of alpha-5-thiophene, benzothieno[3,2-b]benzothiophene, poly {[N,N'-bis(2-octyldodecyl)-naphthalene-1,4,5,8-bis(dicarboximide)-2,6-diyl]alt-5,5'-(2,2'-bithiophene)}, alkyl-substituted polythienylenevinylene and dodecylthiophene, phthalocyanine with or without metal, naphthalene tetra carboxylic acid diimide, and their derivatives.

The gate electrode may include at least one selected from gold, nickel, copper, silver, aluminum, molybdenum, an aluminum alloy, a molybdenum alloy, and a polyethylenedioxythiophene/polystyrenesulfonate mixture.

The OTFT may be a top gate type, a bottom gate type, a top contact type, or a bottom contact type.

The OTFT may be a p-type OTFT.

The OTFT may be an ambipolar OTFT.

Embodiments are also directed to an organic light-emitting display apparatus including an OTFT according to an embodiment.

BRIEF DESCRIPTION OF THE DRAWINGS

Features will become apparent to those of skill in the art by describing in detail example embodiments with reference to the attached drawings in which:

FIGS. 6A to 6D illustrate graphs showing transition curves of PC12TV12T OTFTs prepared in Examples 4 to 6 and Comparative Example 3;

DETAILED DESCRIPTION

Figure 1:
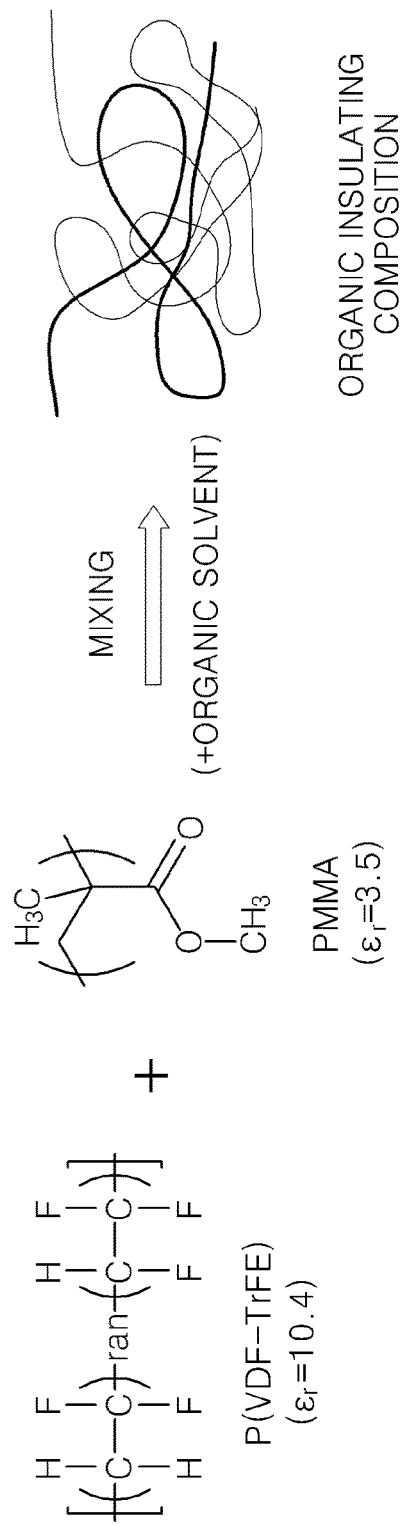
FIG. 1 illustrates a conceptual view of preparation of an organic insulating layer composition according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The terms used in the present specification are merely used to describe the example embodiments in detail, and are not intended to limit the embodiments. In the description, some minor details may be omitted for conciseness of explanation; likewise, repeated descriptions of the same or similar elements may be omitted. Expressions such as "at least one of," when preceding a list of elements, modify the entire list of elements and do not modify the individual elements of the list.

According to an example embodiment, an organic insulating layer composition includes 50 parts to 90 parts by volume of a polymer mixture including an organic polymer including at least one of fluorine (—F) and chlorine (—Cl) in asymmetrical groups and 5 parts to 10 parts by volume of an amorphous polymer, and an organic solvent. As would be apparent to one of ordinary skill in the art from the description and drawings, the asymmetrical groups may have a different number of fluorine and/or chlorine functional groups substituted thereto as different repeating units, e.g., as shown for P(VDF-TrFE) in FIG. 1, wherein the VDF unit has a different number of fluorine and/or chlorine atoms relative to the TrFE unit. In an implementation, the organic polymer may include side chains and/or terminal groups that include such fluorine and/or chlorine substitutions.

Fluorine and chlorine are functional groups that have a large electronegativity. When used in an organic insulating layer, the organic polymer including at least one of fluorine and chlorine in asymmetrical groups may have a high dipole moment created by the fluorine or chlorine disproportionately located in the organic polymer. Without being bound by theory, it is believed that the high dipole moment helps to accumulate holes at an organic semiconductor layer area in a p-type organic thin film transistor (OTFT) and thus may help increase charge mobility. Also, when the organic polymer is used in the organic insulating layer, a threshold of charges injected to the organic semiconductor layer from source/drain electrodes due to the high dipole moment may be lowered, and thus a contact resistance may be reduced and a charge injecting efficiency may be increased.

An organic polymer including at least one of fluorine and chlorine in asymmetrical groups may form crystalline structures during a heat-treatment, and may thus exhibit high ferroelectricity. When a cyclic voltage is applied to such an OTFT, the ferroelectricity may increase hysteresis on a transition curve of the OTFT and thus the performance of the OTFT may be unstable.

When used in a p-type OTFT, the organic polymer including at least one of fluorine and chlorine in asymmetrical groups may improve hole mobility, but when used in an n-type OTFT, the organic polymer may have a tendency of decreasing electron mobility. Without being bound by theory, it is believed that this occurs because a direction of the dipole moment of the organic insulating layer created by the organic polymer obstructs accumulation of electrons.

The organic insulating layer composition according to an example embodiment includes the amorphous polymer mixed with the organic polymer including at least one of fluorine and chlorine as asymmetrical groups, and thus when used in the p-type OTFT, the ferroelectricity of the organic insulation layer composition may be reduced or eliminated, and when used in the n-type OTFT, the tendency of decreasing the electron mobility of the organic insulation layer composition may be reduced or eliminated.

In the present example embodiment, the organic insulating layer composition includes the polymer mixture, in which 50 parts to 90 parts by volume of the organic polymer including at least one of fluorine and chlorine in asymmetrical groups and 10 parts to 50 parts by volume of the amorphous polymer are mixed, dissolved in the organic solvent. When a content of the organic polymer and a content of the amorphous polymer satisfy the ranges above, a size of the dipole moment may be maintained high while formation of crystalline structures may be suppressed, and thus the ferroelectricity of the organic insulation layer composition may be reduced or eliminated and the electron mobility of the organic insulation layer composition may be at a very low level.

The organic polymer including at least one of fluorine and chlorine in asymmetrical groups may be or may include at least one selected from poly(vinylidene fluoride-trifluoroethylene) (P(VDF-TrFE)), poly(vinylidene fluoride-trifluoroethylene-chlorofluoroethylene) (P(VDF-TrFE-CFE)), poly(vinylidene fluoride-trifluoroethylene-chlorodifluoroethylene) (P(VDF-TrFE-CDFE)), poly(vinylidene fluoride-trifluoroethylene-chlorotrifluoroethylene) (P(VDF-TrFE-CTFE)), and poly (vinylidene fluoride-trifluoroethylene-hexafluoropropylene) (P(VDF-TrFE-HFP)). The organic polymer including at least one of fluorine and chlorine in asymmetrical groups, when used in an organic insulating layer, may create a high dipole moment and may effectively accumulate holes in an organic semiconductor layer.

A number average molecular weight of the organic polymer may be about 5,000 to about 1,000,000. When the number average molecular weight of the organic polymer is within the range above, mixing of the organic polymer and the amorphous polymer may be readily performed, and thus an organic insulating layer may be stable.

In an example embodiment, P(VDF-TrFE) may be used as the organic polymer. P(VDF-TrFE) is an insulating material having a high dipole moment and is a copolymer formed by copolymerizing a vinylidene fluoride (VDF) monomer and a trifluoroethylene (TrFE) monomer. P(VDF-TrFE) may be a random copolymer below including monomer units repeating in random order (ran):

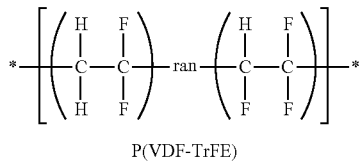

P(VDF-TrFE)

According to the present example embodiment, the organic polymer of P(VDF-TrFE) includes fluorine atoms that are attached in asymmetrical numbers in the organic polymer, and thus the organic polymer may exhibit a high dipole moment and a relatively high dielectric permittivity compared to other polymers. When P(VDF-TrFE) is used in the organic insulating layer composition to form an organic insulating layer, a driving voltage of a device may be reduced by the high dielectric permittivity. Crystalline structures of P(VDF-TrFE) may align during a heat-treatment at a temperature of about 150° C. or higher for 10 minutes or more and form beta-form crystals, which may result in the organic polymer having high ferroelectricity. When P(VDF-TrFE) having a strong ferroelectricity is used as the organic insulating layer composition, a large threshold shift and hysteresis may appear on the transition curve while driving the device, which may be understood as a phenomenon caused by a gate voltage applied to the device aligning P(VDF-TrFE) molecules to an opposite direction. In this regard, the uniformity of a device performance may be decreased, and thus the OTFT may not be well suited for use in a display driving circuit, a digital or analog circuit, or the like that requires a threshold voltage having a constant value.

According to the present example embodiment, ferroelectricity may be suppressed by mixing P(VDF-TrFE) and the amorphous polymer. As a result, the ferroelectricity may be suppressed even when the polymer mixture, in which P(VDF-TrFE) and the amorphous polymer are mixed, is heat-treated at a high temperature. Also, when an organic insulating layer is formed, holes may easily accumulate in an electron transport layer between the organic semiconductor layer and the organic insulating layer due to a high dipole moment.

When P(VDF-TrFE) is used as the organic polymer, a copolymer weight ratio of VDF and TrFE may be 55:45 to 95:5. When the copolymer weight ratio is within the range above, the organic polymer may have a dipole moment at a satisfactory level.

The amorphous polymer may be or may include at least one selected from polymethyl methacrylate (PMMA), polystyrene (PS), polyvinylpyrrolidone (PVP), and polyimide (PI). A content of the amorphous polymer may be 50 wt % or less based on a total weight of the mixture of the organic polymer including at least one of fluorine and chlorine in asymmetrical groups and the amorphous polymer. When the content of the amorphous polymer is 50 wt % or less, a dipole moment effect may be maintained at a satisfactory level. When the content of the amorphous polymer is within the range above, the dipole moment may be maintained at a high level, and ferroelectricity may be suppressed.

PMMA is an amorphous polymer that may be used in the polymer mixture. PMMA may be mixed with P(VDF-TrFE) at a pre-determined ratio, and thus ferroelectricity may be suppressed while a size of the dipole moment is maintained between the organic semiconductor layer and the organic insulating layer when forming the organic insulating layer.

A number average molecular weight of the amorphous polymer may be about 10,000 to about 1,000,000. When the number average molecular weight of the organic polymer is within the range above, mixing of the organic polymer and the amorphous polymer may be readily performed, and thus an organic insulating layer may be stable.

According to the present example embodiment, the organic insulating layer composition includes an organic solvent to dissolve the polymer mixture, in addition to 50 parts to 90 parts by volume of the organic polymer including at least one of fluorine and chlorine in asymmetrical groups and 10 parts to 50 parts by volume of the amorphous polymer.

The organic solvent may be any solvent capable of dissolving the polymer mixture. The organic solvent may include at least one selected from dimethyl sulfoxide (DMSO), methyl ethyl ketone (MEK), acetonitrile, and 1-butanone, but is not limited thereto.

In some example embodiments, the organic insulating layer composition may exist as a polymer mixture including 50 parts to 90 parts by volume of the organic polymer including at least one of fluorine and chlorine in asymmetrical groups and 10 parts to 50 parts by volume of the amorphous polymer while the organic solvent is separated, and later when forming the organic insulating layer, the organic solvent may be added to the polymer mixture.

FIG. 1 illustrates a conceptual view of preparation of an organic insulating layer composition according to an example embodiment. Referring to FIG. 1, P(VDF-TrFE) is used as an organic polymer including at least one of fluorine and chlorine in asymmetrical groups and PMMA is used as an amorphous polymer. P(VDF-TrFE) and PMMA are mixed and dissolved in an organic solvent to prepare the organic insulating layer composition.

Another example embodiment provides a method of forming an organic insulating layer. The method may include coating a top of an organic semiconductor layer or a top of a gate electrode with the organic insulating layer composition including 50 parts to 90 parts by volume of the organic polymer including at least one of fluorine and chlorine in asymmetrical groups and 10 parts to 50 parts by volume of the amorphous polymer; and heat-treating a coating layer formed by the coating.

The method of forming the organic insulating layer includes a coating process and a heat-treating process.

The coating process includes coating the organic insulating layer composition by using a spin coating, deep coating, printing, inkjet, or roll coating method.

The heat-treating process is a process of removing a solvent by heat-treating the coating layer formed in the coating process. The heat-treating may be performed at a temperature of about 150° C. or less. Since the organic insulating layer composition includes a polymer with a large dipole moment, when heat-treated at a temperature of about 150° C. or higher, ferroelectricity revelation may occur, and thus hysteresis of a device may be increased. Although the amorphous polymer is included in the organic insulating layer composition to suppress the ferroelectricity revelation, setting a temperature for the heat-treatment to form the organic insulating layer to be relatively low is preferable in suppressing the ferroelectricity.

For example, the organic insulating layer may be formed by spin coating the organic insulating layer composition to form the coating layer, and then the coating layer is heat-treated at a temperature of 70° C. to 100° C. for 1 to 3 hours.

The organic insulating layer may be selectively formed only on a top of the p-type organic semiconductor layer to improve the performance of a p-type OTFT, and an insulating layer on a top of the n-type organic semiconductor layer may be formed of an insulating material that is different to the one of the organic insulating layer.

In this regard, the method of forming the organic insulating layer may include coating the top of the p-type organic semiconductor layer with a first organic insulating layer composition to form a first coating layer, removing a portion of the first coating layer formed on the top of the p-type organic semiconductor layer coating layer; and coating the top of the p-type organic semiconductor layer from which the portion of the first coating layer is removed with a second organic insulating layer composition, where the first organic insulating layer composition corresponds to a general gate insulating layer composition that is formed on the top of the n-type organic semiconductor layer, and the second organic insulating layer composition corresponds to the organic insulating layer composition according to an example embodiment, including 50 parts to 90 parts by volume of the organic polymer including at least one of fluorine and chlorine in asymmetrical groups and 10 parts to 50 parts by volume of the amorphous polymer.

In the method of forming the organic insulating layer, the removing of the portion of the first coating layer may include only removing the first coating layer formed on the top of the p-type organic semiconductor layer, e.g., by using an inkjet printing method.

According to another example embodiment, an organic insulating layer formed by using the method of forming the organic insulating layer is provided. The organic insulating layer includes a mixture of the organic polymer with a large dipole moment and the amorphous polymer. Accordingly, ferroelectricity may be effectively suppressed, and holes may be easily accumulated at an interface between the organic insulating layer and the organic semiconductor layer, and thus hole mobility may be significantly improved. Particularly, the organic insulating layer formed by heat-treating at a temperature lower than a general temperature for forming an organic insulating layer may effectively suppress the ferroelectricity revelation.

The organic insulating layer formed as described above may have a thickness of 100 nm to 400 nm. When the thickness of the organic insulating layer is within the range above, holes may easily accumulate at the interface between the organic insulating layer and the organic semiconductor layer.

Figure 2:
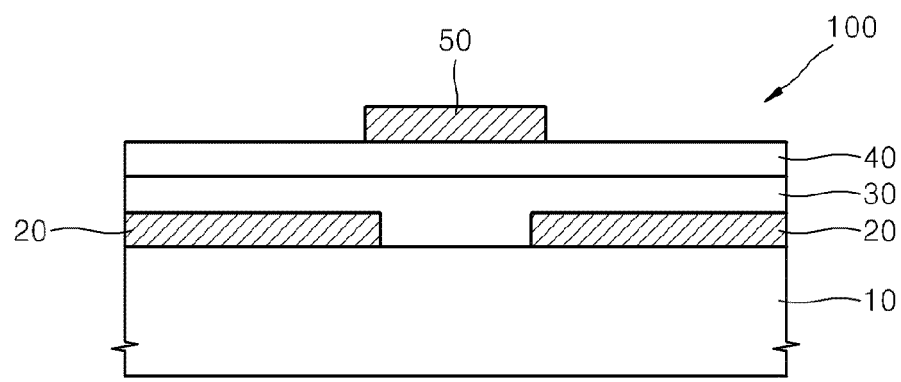
FIG. 2 illustrates a schematic cross-sectional view of a structure of an organic thin film transistor (OTFT) according to another example embodiment.

Hereinafter, a structure and function of an OTFT according to another example embodiment will be described in detail with reference to FIG. 2. FIG. 2 illustrates a schematic cross-sectional view of a structure of an OTFT 100 according to another example embodiment.

According to the present example embodiment, the OTFT 100 includes a substrate 10, source/drain electrodes 20, an organic semiconductor layer 30, an organic insulating layer 40 formed by coating and heat-treating an organic insulating layer composition including 50 parts to 90 parts by volume of an organic polymer including at least one of fluorine and chlorine in asymmetrical groups and 10 parts to 50 parts by volume of an amorphous polymer, and a gate electrode 50.

The substrate 10 may be a transparent substrate, such as glass, or a flexible substrate, such as a silicon substrate, a plastic substrate, or a metal foil substrate. Examples of the plastic substrate may be polyethersulphone, polyacrylate, polyetherimide, polyethylene naphthalate, polyethylene terephthalate, polyphenylene sulfide, polyallylate, polyimide, polycarbonate, cellulose triacetate, and cellulose acetate propionate.

A particular functional group in a molecule constructing a substrate is necessary in a general OTFT using a self-assembled monolayer (SAM), and the SAM is formed by chemically binding with the substrate including the molecule including the functional group. For example, the general OTFT using the SAM may be only applied to a $SiO_2$ substrate including a particular functional group and thus may not be applied to various substrates including a plastic flexible substrate. However, the OTFT 100 may use various substrates 10 regardless of including the molecules including a particular functional group in the substrate 10.

The source/drain electrodes 20 are disposed on the substrate 10. The source/drain electrodes 20 may be prepared on the substrate 10 by using a photolithography method or a method of forming metal thin films that are physically separated using a shadow mask substrate. The source/drain electrodes 20 may be formed by using various printing processes, for example, a printing process such as inkjet printing. The source/drain electrodes 20 may be formed of at least one selected from gold (Au), silver (Ag), molybdenum (Mo), copper (Cu), indium tin oxide (ITO), PEDOT/PSS and graphene.

The organic semiconductor layer 30 is disposed on the source/drain electrodes 20.

The organic semiconductor layer 30 may be a p-type organic semiconductor layer. When the p-type organic semiconductor layer is formed, hole accumulation may easily occur at an area of the organic semiconductor layer 30 including an interface between the organic insulating layer 40 according to an example embodiment and the organic semiconductor layer 30 due to a large dipole moment of the organic insulating layer 40.

An organic semiconductor material for forming the p-type organic semiconductor layer may be at least one selected from polythiophene, thienothiophene, triisopropylsilyl pentacene, pentacene precursor, alpha-6-thiophene, polyfluorene, pentacene, tetracene, anthracene, perylene, rubrene, coronene, perylene tetracarboxylic diimide, polyparaphenylene vinylene, polythiophene vinylene, polythienylenevinylene, oligothiophene of alpha-5-thiophene, benzothieno[3,2-b]benzothiophene (BTBT), poly {[N,N'-bis(2-octyldodecyl)-naphthalene-1,4,5,8-bis(dicarboximide)-2,6-diyl]-alt-5,5'-(2,2'-bithiophene)} (P(NDI2ODT2)), alkyl-substituted polythienylenevinylene and dodecylthiophene (PC12TV12T), phthalocyanine with or without metal, naphthalene tetra carboxylic acid diimide, and their derivatives.

The organic semiconductor layer 30 may be an n-type organic semiconductor layer. When the n-type organic semiconductor layer is formed, electron accumulation in the organic semiconductor layer may be obstructed in an OTFT including a common organic insulating layer, but not in the OTFT 100 including the organic insulating layer 40, and thus a decrease in electron mobility may be minimized, and holes may accumulate.

An example of the organic semiconductor material for forming the n-type organic semiconductor layer may be poly{[N,N'-bis(2-octyldodecyl)-naphthalene-1,4,5,8-bis(dicarboximide)-2,6-diyl]-alt-5,5'-(2,2'-bithiophene)} (P(NDI2OD-T2).

When organic materials that may be a base material of the organic semiconductor layer 30 are dissolved in an organic solvent, a device may be manufactured through a printing or a solution process, or a chemical structure of the organic material may be changed, and thus desired electrical characteristics of the organic material may be controlled.

In the present example embodiment, the organic insulating layer 40 is disposed on the organic semiconductor layer 30. The organic insulating layer 40 serves as a gate insulating layer.

The organic insulating layer 40 is formed by coating and heat-treating an organic insulating layer composition including a polymer mixture and an organic solvent, wherein the polymer mixture includes an organic polymer with a large dipole moment due to including at least one of fluorine and chlorine in asymmetrical groups and an amorphous polymer. An example of the organic polymer with a large dipole moment may be P(VDF-TrFE), and an example of the amorphous polymer may be PMMA.

When the organic solvent is removed by heat-treating the organic polymer with a large dipole moment at a temperature of about 150° C. or higher, ferroelectricity may be revealed, and thus hysteresis of a device may increase. Therefore, the organic solvent may be removed by forming a coating layer with the organic insulating layer composition by using a solution process and heat-treating the coating layer at a temperature of about 150° C. or less to form a sold thin film.

The gate electrode 50 is disposed on the organic insulating layer 40. The gate electrode 50 may be formed by using various printing processes, for example, a printing process such as inkjet printing using a metal nanoparticle solution or PEDOT:PSS conductive polymer as ink. When the gate electrode 50 is formed by using the printing process, a vacuum process may be omitted, and thus a manufacture cost may be reduced. The gate electrode 50 may be formed of at least one selected from gold (Au), nickel (Ni), copper (Cu), silver (Ag), aluminum (Al), molybdenum (Mo), an Al-alloy, a Mo-alloy, and a polyethylenedioxythiophene (PEDOT)/polystyrene-sulfonate (PSS) mixture. Also, the gate electrode 50 may be a conductive thin film that has an excellent adhesive property with the organic insulating layer 40.

In an example embodiment, all elements of the organic insulating layer 40 and the electrodes, namely, the source/drain electrodes 20 and the gate electrode 50, of the OTFT 100 may be formed by using a solution or printing process with an organic material or a material available for printing, as well as the organic semiconductor layer 30, and thus the OTFT 100 may be manufactured by using continuous printing processes.

The OTFT 100 may be a top gate type or a bottom gate type depending on a location of a gate of the OTFT 100, or may be a top contact type or a bottom contact type depending on a location of the organic semiconductor layer 30 of the OTFT 100. The OTFT 100 shown in FIG. 2 is a top gate-bottom contact type.

The OTFT 100 may be a p-type OTFT. In the p-type OTFT, the organic semiconductor layer 30 is formed of a material that forms a p-type organic semiconductor. In this regard, holes may be easily accumulated at an area of the organic semiconductor layer 30, and thus the p-type OTFT may have a high charge mobility.

The OTFT 100 may be an ambipolar OTFT. In the ambipolar OTFT, the organic semiconductor layer 30 is formed of a material that forms a p-type organic semiconductor and a material that forms an n-type organic semiconductor. According to an example embodiment, at an area of the organic semiconductor layer 30, a decrease in the electron mobility in the n-type organic semiconductor is almost none, and charge mobility is improved as holes easily accumulate in the p-type organic semiconductor.

Figure 3:
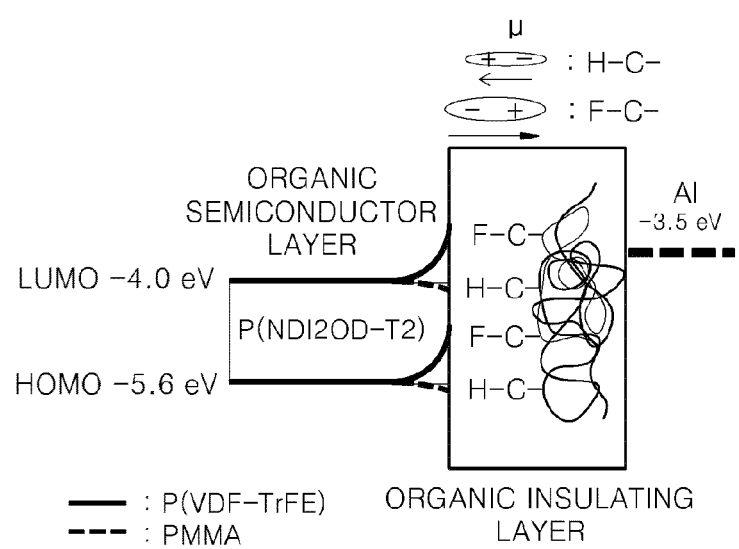
FIG. 3 illustrates a schematic view of an energy band diagram of an interface between an organic semiconductor layer and an organic insulating layer of an OTFT according to an example embodiment.

FIG. 3 illustrates a schematic view of an energy band diagram of an interface between an organic semiconductor layer and an organic insulating layer of an OTFT according to an example embodiment.

Referring to FIG. 3, the organic semiconductor layer is a p-type organic semiconductor layer, and the organic insulating layer is formed of a mixture of P(VDF-TrFE) and PMMA. Without being bound by theory, it is believed that, at the interface between the organic semiconductor layer and the organic insulating layer, a —C—F dipole of P(VDF-TrFE) increases accumulation of positive charge carriers at the interface with the organic semiconductor layer, and a —C—H dipole of PMMA increases accumulation of negative charge carriers at the interface with the organic semiconductor layer. Without being bound by theory, it is believed that the increases of accumulation of the positive and negative charge carriers are due to molecular orbital energy modulation between the organic insulating layer and the organic semiconductor layer shifting up highest occupied molecular orbital (HOMO) and shifting down lowest unoccupied molecular orbital (LUMO).

According to another example embodiment, an organic light-emitting display apparatus including the OTFT is provided. For example, the organic light-emitting display apparatus may include a substrate body, a driving circuit unit that is formed on the substrate body and includes the OTFT, an organic light-emitting device formed on the driving circuit unit, and a front substrate covering the organic light-emitting device.

Hereinafter, the organic insulating layer composition, organic insulating layer, and OTFT according to an example embodiment will be described in further detail. The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE 1

A glass substrate (Corning, Eagle 2000) was immersed in acetone, cleaned in an ultrasonic bath for 10 minutes, and sufficiently dried with nitrogen gas. Then, the glass substrate was cleaned using isopropyl alcohol and distilled water for 10 minutes each and dried with nitrogen gas again to completely remove a residual solvent. Next, the glass substrate was cleaned for 100 seconds by using a plasma surface cleaning apparatus. Gold plates with different lengths, i.e., 2 µm, 5 µm, 10 µm, and 20 µm, and a width of 1 mm were used to form source/drain electrodes by using a photolithography method.

P(NDI2OD-T2) (Polyera, N2200™) was completely dissolved in chlorobenzene (Sigma-Aldrich), as a solvent, at a content of about 0.5 wt % to about 1.0 wt % to prepare an organic semiconductor solution. A process of preparing the organic semiconductor solution was performed in a glove box filled with nitrogen so as to minimize the influence of air and moisture (the content of oxygen<100 ppm and the content of moisture<100 ppm). The organic semiconductor solution was spin-coated on the glass substrate at a rate of 2000 rpm for 1 minute to form a coating layer. The coating layer was heat-treated at a temperature of about 100° C. to about 200° C. for about 30 minutes to about 60 minutes using a hot plate to completely remove the solvent to prepare an organic semiconductor layer as a solid thin film with a thickness of about 30 mm to about 70 mm. The heat-treatment was performed in the glove box for preparing the organic semiconductor solution so as to minimize the influence of air and moisture.

In order to form the organic insulating layer on the organic semiconductor layer, a P(VDF-TrFE) copolymer including VDF and TrFE at a polymer ratio of 75:25 was dissolved in DMSO, as a solvent, at a concentration of 70 mg/mL to prepare a P(VDF-TrFE) solution. Then, PMMA was dissolved in DMSO, as a solvent, to prepare a PMMA solution. The P(VDF-TrFE) solution and the PMMA solution were mixed at a volume ratio of 5:5 to prepare an organic insulating layer composition. The organic insulating layer composition was spin-coated in the glove box, where nitrogen is purged, at a rate of 4000 to about 6000 rpm for about 1 minute to about 2 minutes to form a coating layer.

Figure 9:
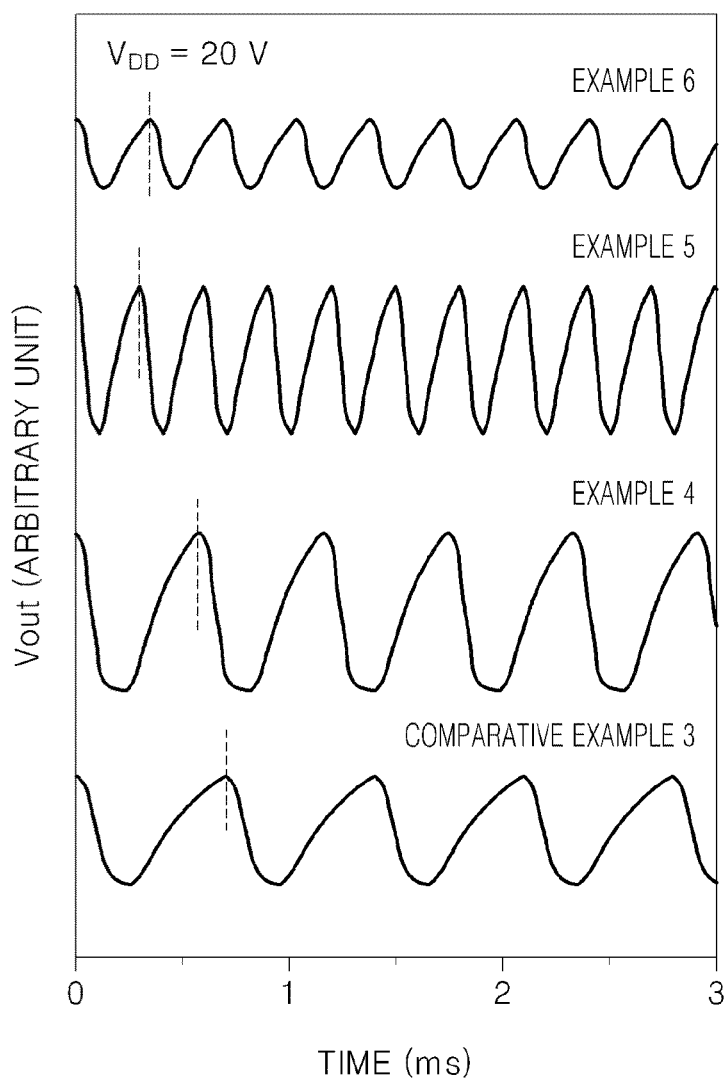
FIG. 9 illustrates a graph showing output voltages ($V_{out}$s) of ring oscillators prepared in Examples 4 to 6 and Comparative Example 3.

The coating layer was heat-treated on a hot plate at a temperature of about 80° C. for about 2 hours to completely remove the solvents, and thus an organic insulating layer with a thickness of about 100 nm to about 400 nm was prepared. An atomic force microscopy (AFM) surface image of the organic insulating layer is shown in FIG. 9.

Aluminum was deposited on the organic insulating layer by using a thermal-deposition process in a $10^{-6}$ torr high-vacuum chamber. To be formed only on a channel area of the OTFT, the gate electrode was patterned by using a pre-prepared shadow mask. A thickness of the Al-deposited gate electrode was about 30 nm to about 50 nm.

EXAMPLE 2

An OTFT was prepared in the same manner as in Example 1, except that the P(VDF-TrFE) solution and the PMMA solution were mixed at a volume ratio of 7:3.

EXAMPLE 3

An OTFT was prepared in the same manner as in Example 1, except that the P(VDF-TrFE) solution and the PMMA solution were mixed at a volume ratio of 9:1.

COMPARATIVE EXAMPLE 1

An OTFT was prepared in the same manner as in Example 1, except that an organic insulating layer composition was prepared by using the only PMMA solution without mixing with the P(VDF-TrFE) solution.

COMPARATIVE EXAMPLE 2

An OTFT was prepared in the same manner as in Example 1, except that an organic insulating layer composition was prepared by using the only P(VDF-TrFE) solution without mixing with the PMMA solution.

EXAMPLE 4

An OTFT was prepared in the same manner as in Example 1, except that an organic insulating layer composition was prepared by using the method below.

PC12TV12T was completely dissolved in chlorobenzene, as a solvent, at a concentration of about 0.5 wt % to about 1 wt % to prepare an organic semiconductor solution. The organic semiconductor solution was spin-coated on a glass substrate at a rate of 2000 rpm for 1 minute in a nitrogen-purged glove box to form a coating layer. The coating layer formed in the glove box was heat-treated at a temperature of about 100° C. to about 150° C. for 30 minutes to 60 minutes to completely remove the solvent, and thus an organic semiconductor layer was prepared (a mixing ratio of the P(VDF-TrFE) solution and the PMMA solution for preparing the organic insulating layer composition was 5:5 in volume).

EXAMPLE 5

An OTFT was prepared in the same manner as in Example 4, except that the P(VDF-TrFE) solution and the PMMA solution were mixed at a volume ratio of 7:3 to prepare an organic insulating layer composition. Also, a ring oscillator was prepared by using the OTFT.

EXAMPLE 6

An OTFT was prepared in the same manner as in Example 4, except that the P(VDF-TrFE) solution and the PMMA solution were mixed at a volume ratio of 9:1 to prepare an organic insulating layer composition. Also, a ring oscillator was prepared by using the OTFT.

COMPARATIVE EXAMPLE 3

An OTFT was prepared in the same manner as in Example 1, except that an organic insulating layer composition was prepared by using the PMMA solution without mixing with the P(VDF-TrFE) solution. Also, a ring oscillator was prepared by using the OTFT.

EVALUATION EXAMPLE

Figure 4A:
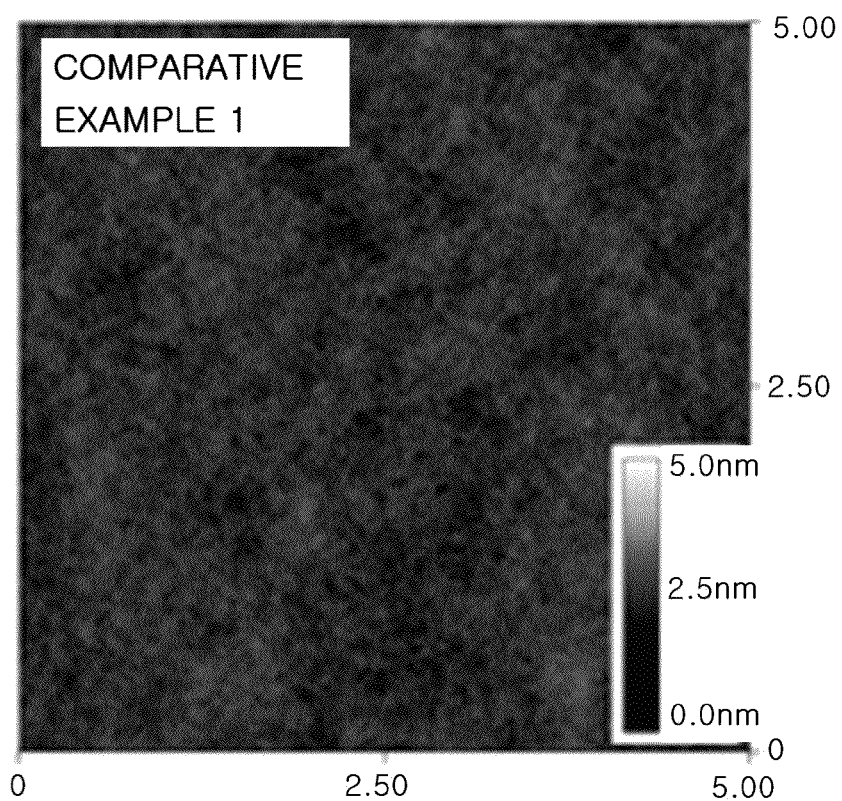
FIGS. 4A to 4E illustrate atomic force microscopy (AFM) images of surface statuses of the organic insulating layers prepared in Examples 1 to 3 and Comparative Examples 1 and 2.
Figure 4B:
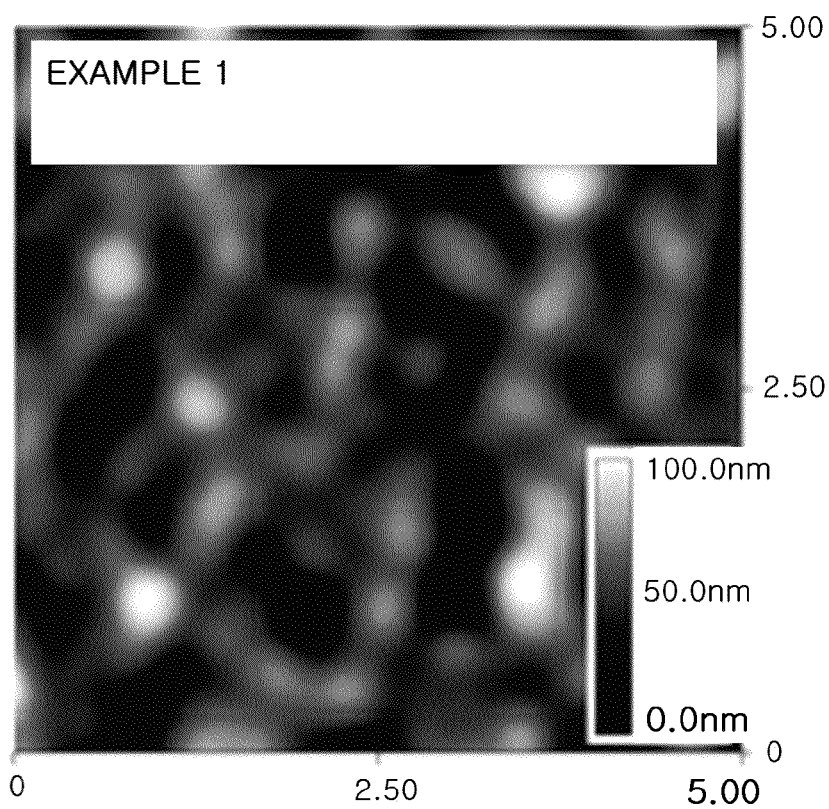
Figure 4C:
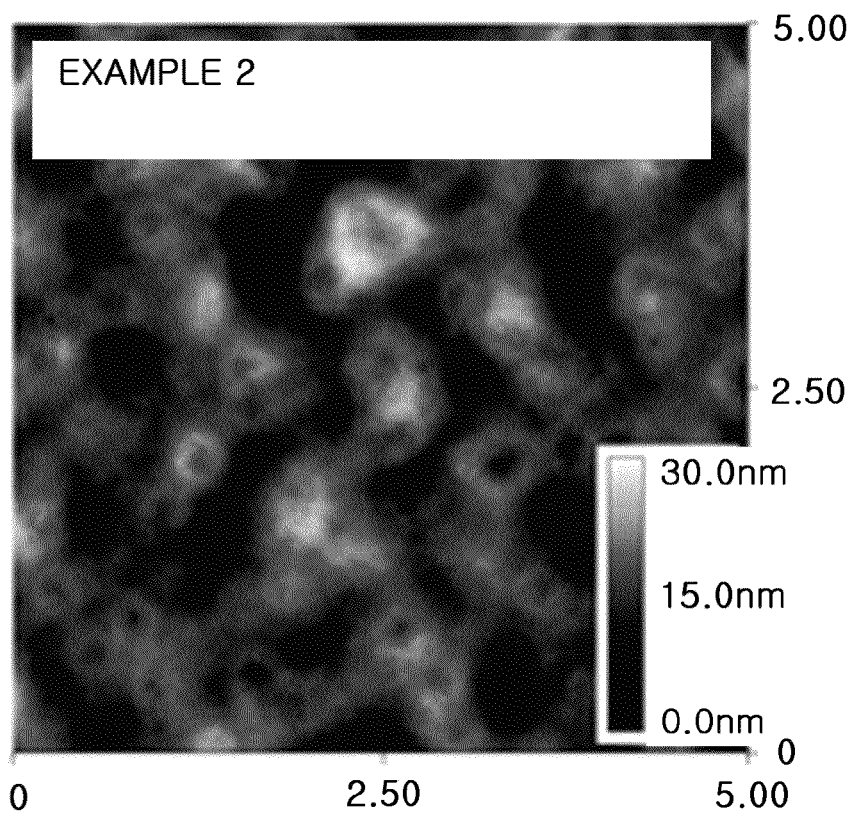
Figure 4D:
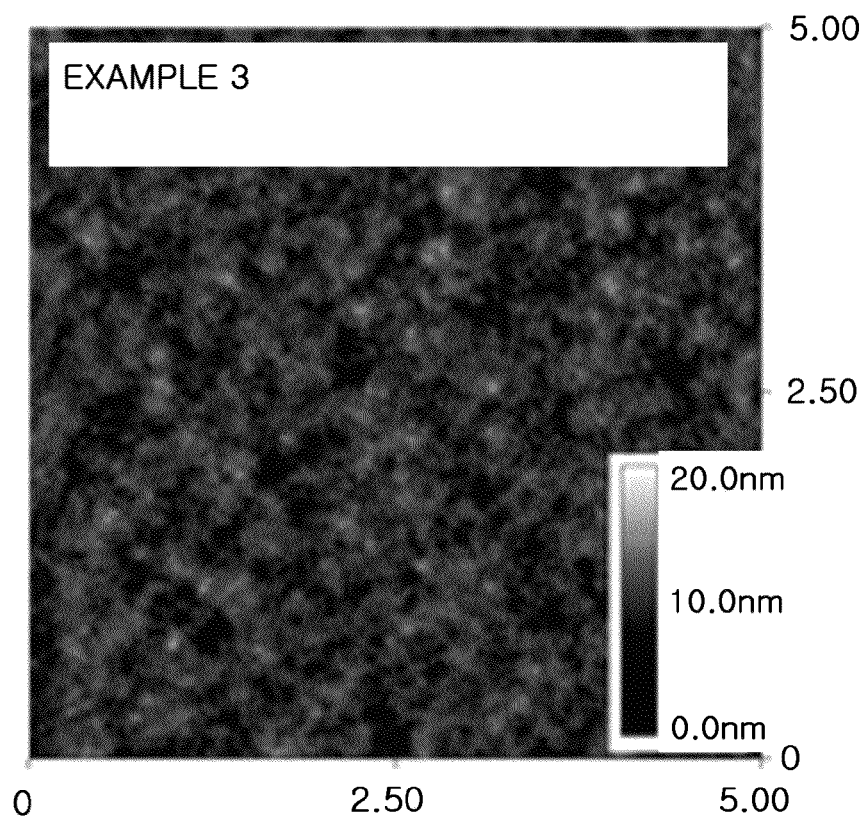
Figure 4E:
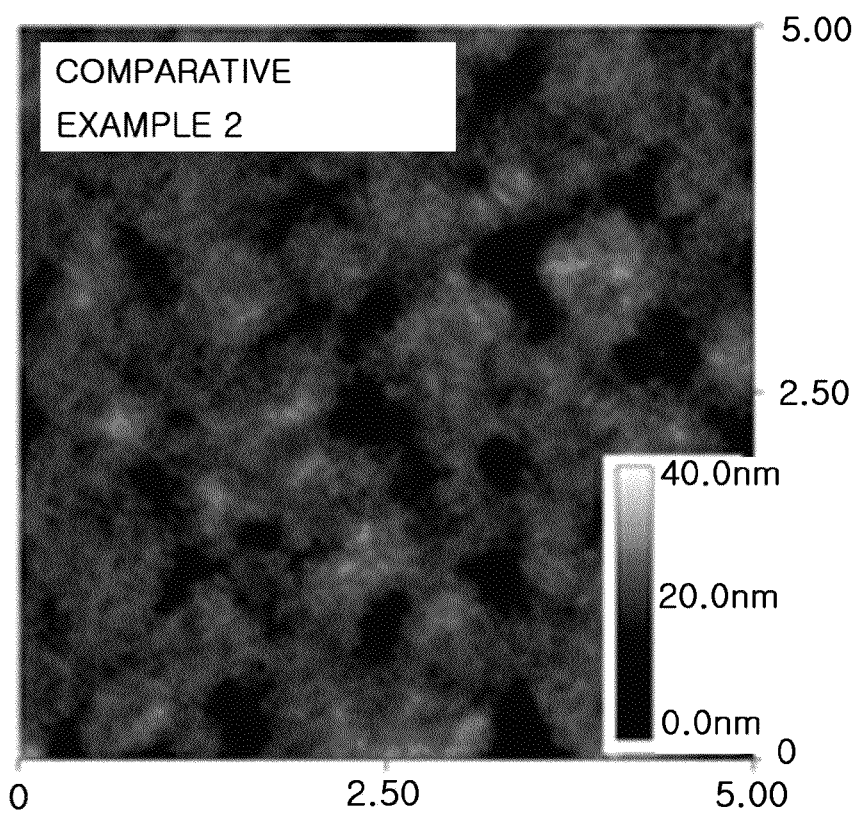
Figure 4F:
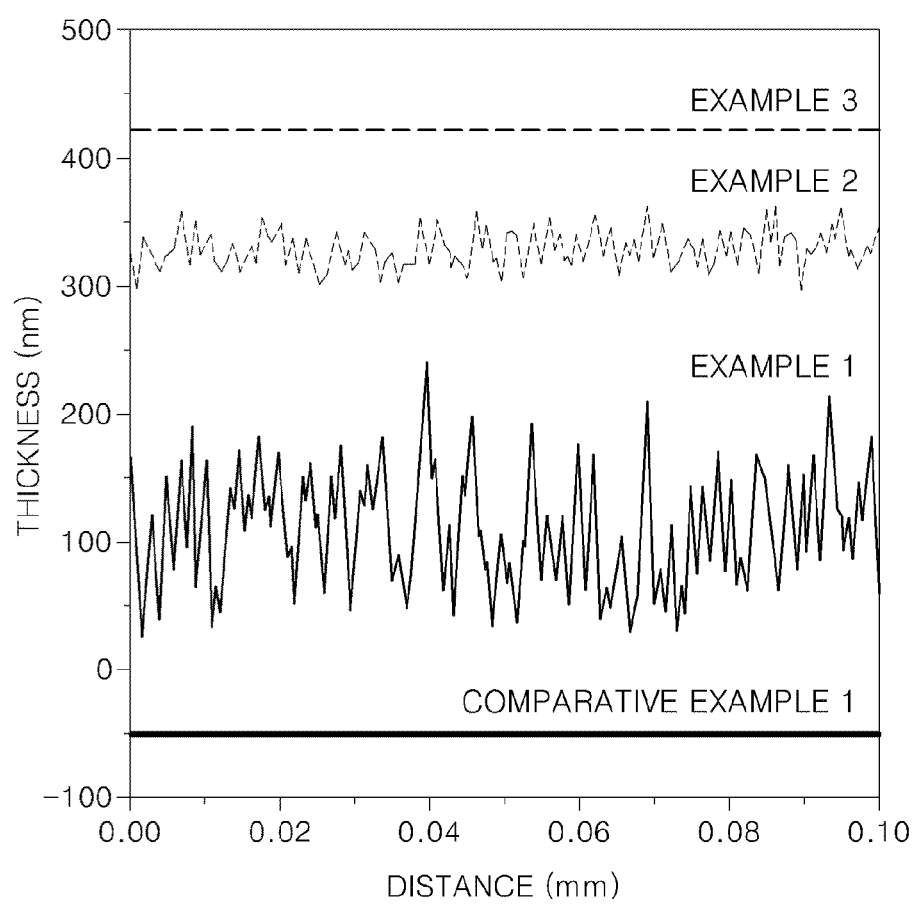
FIG. 4F illustrates measurements of surface variables.
Figure 5A:
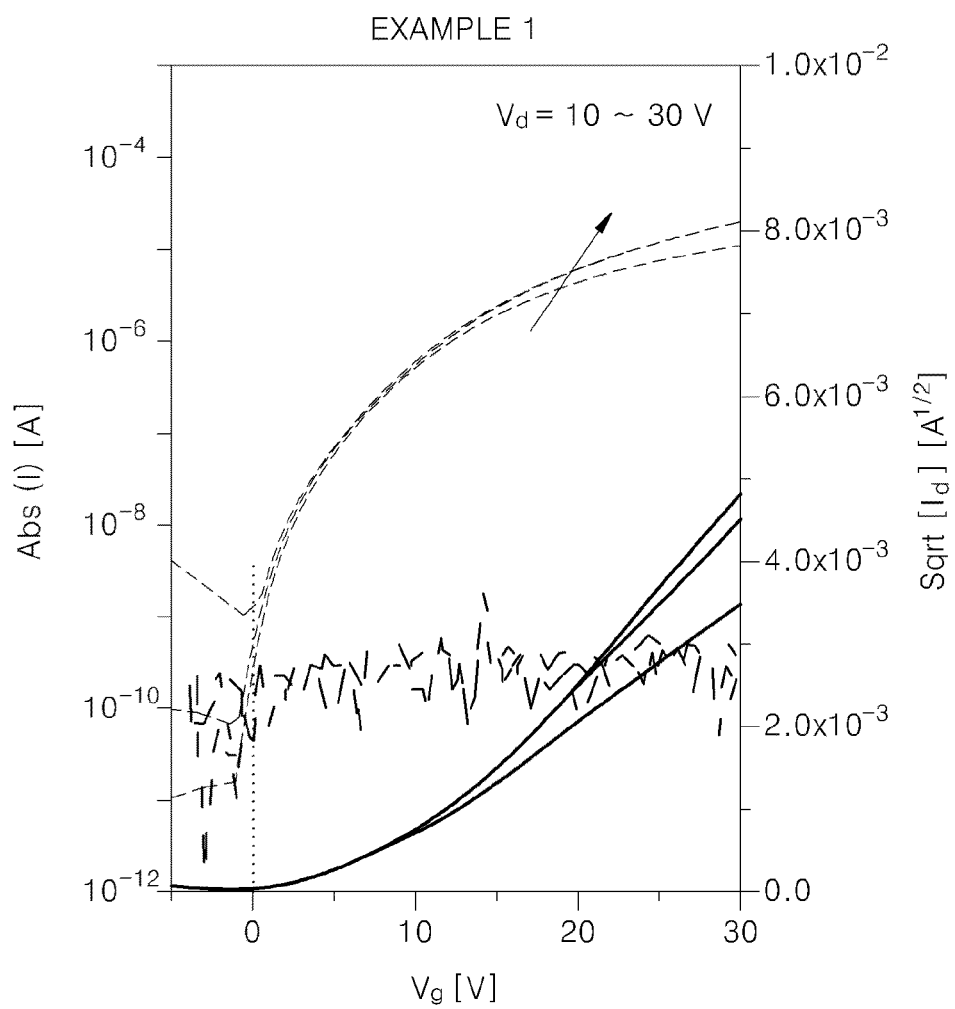
FIGS. 5A to 5D illustrate graphs showing transition curves of P(NDI2OD-T2) OTFTs prepared in Examples 1 to 3 and Comparative Example 1.
Figure 5B:
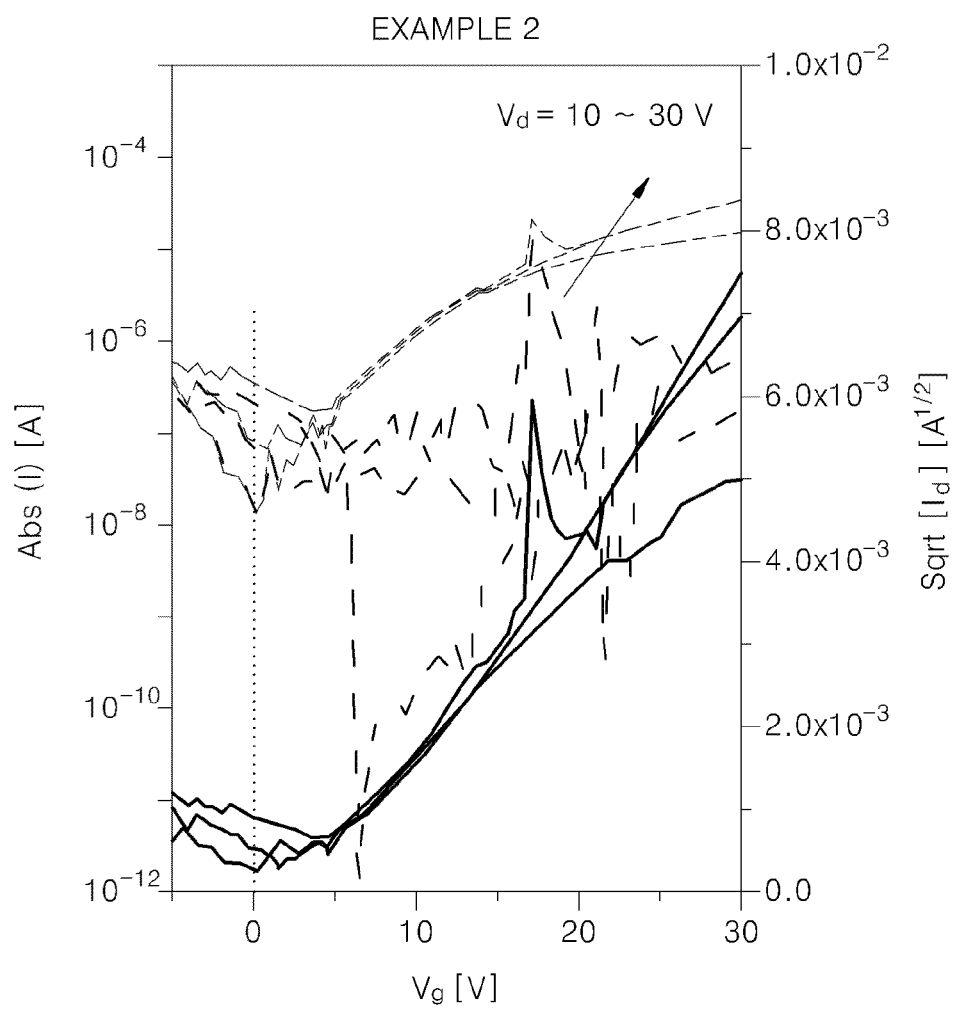
Figure 5C:
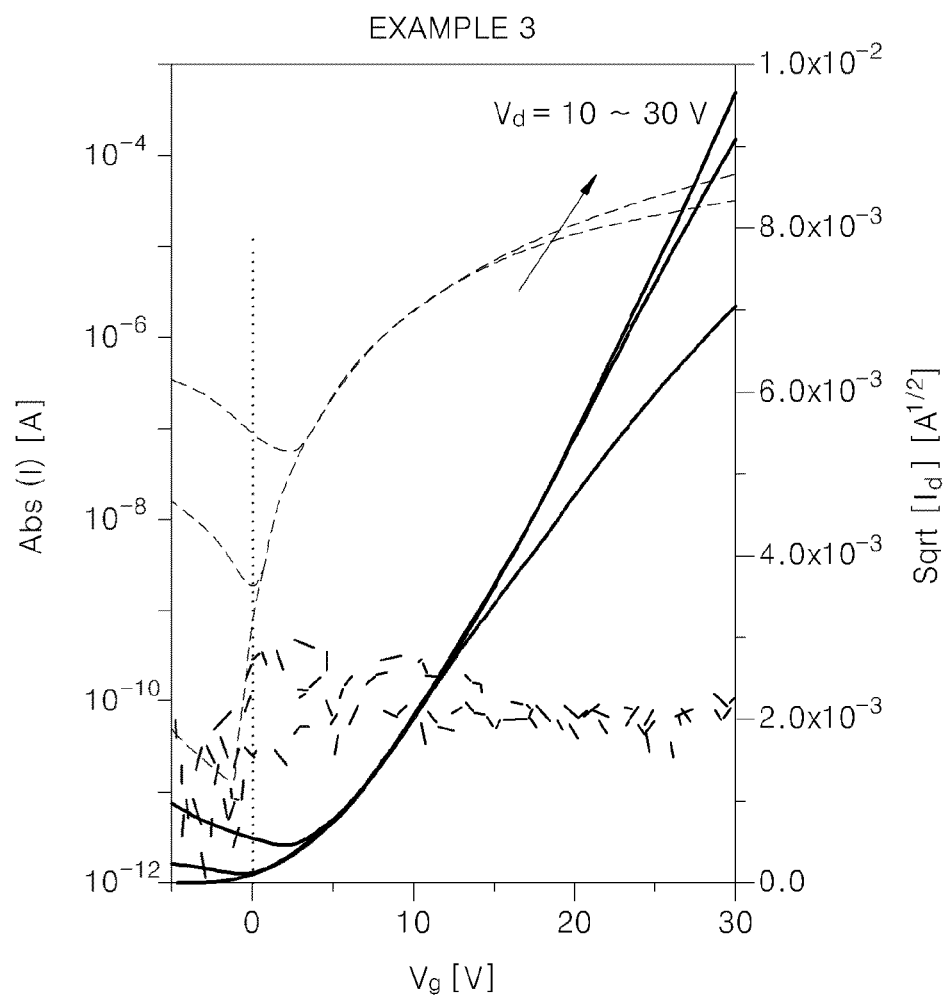
Figure 5D:
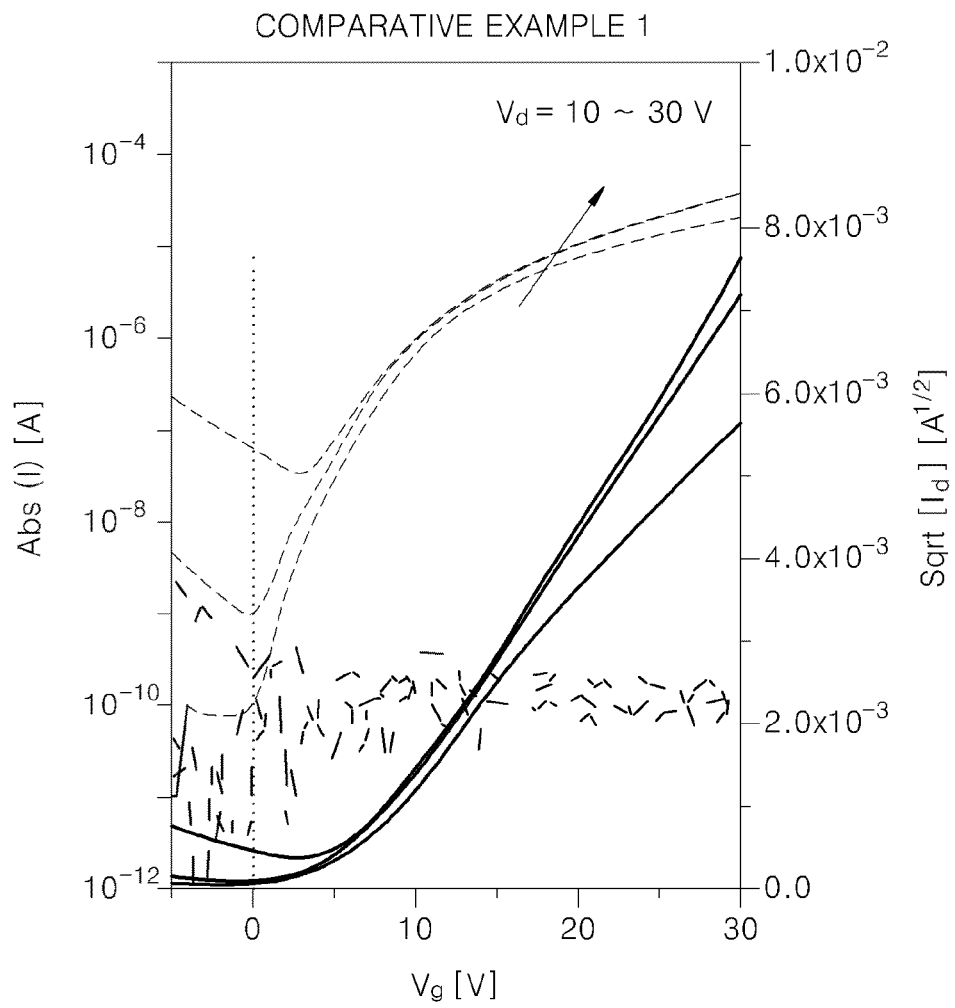
Figure 6A:
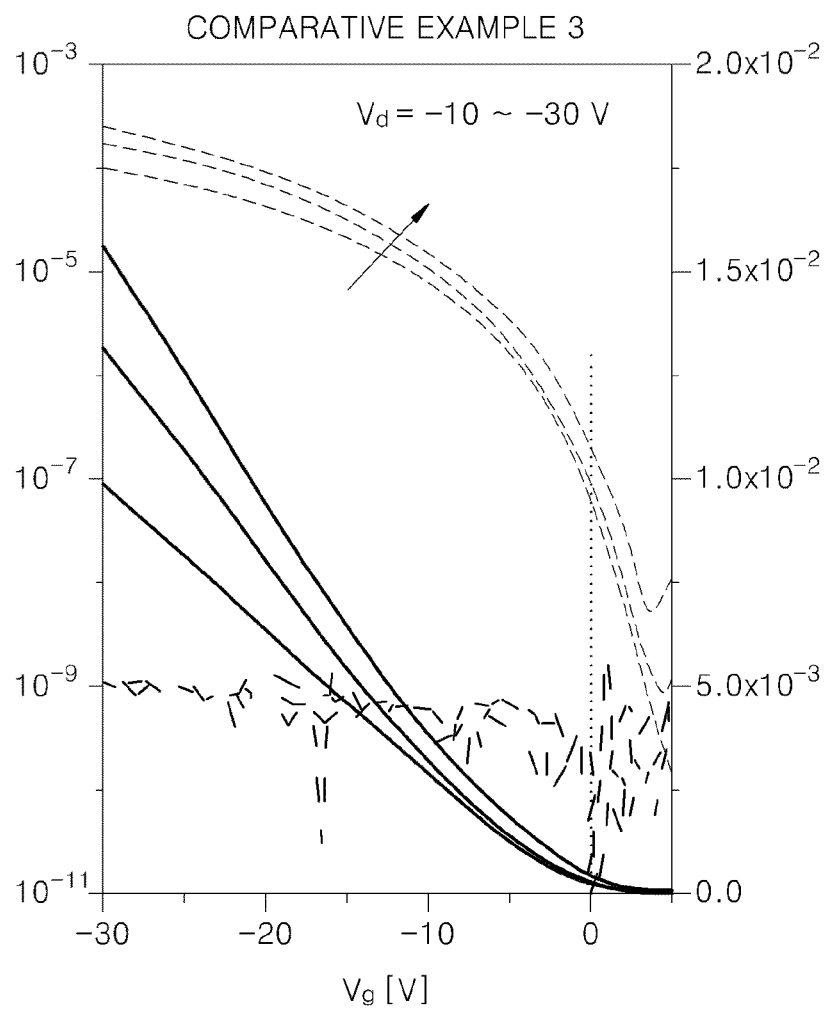
Figure 6C:
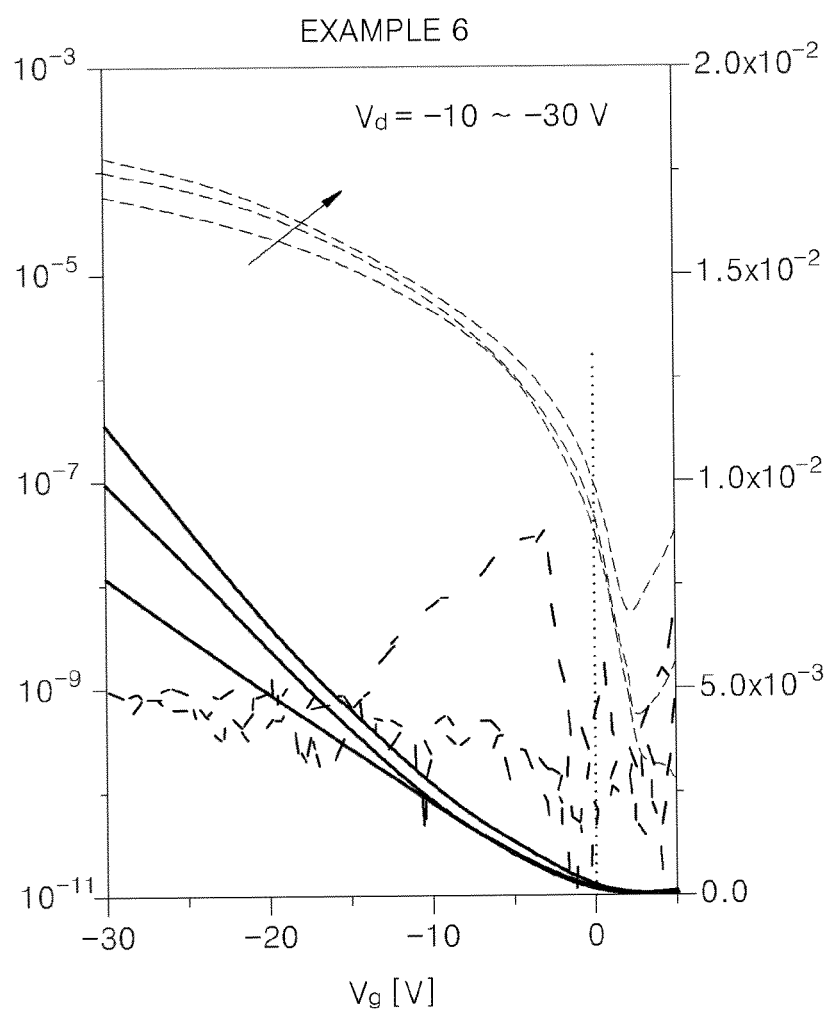
Figure 6D:
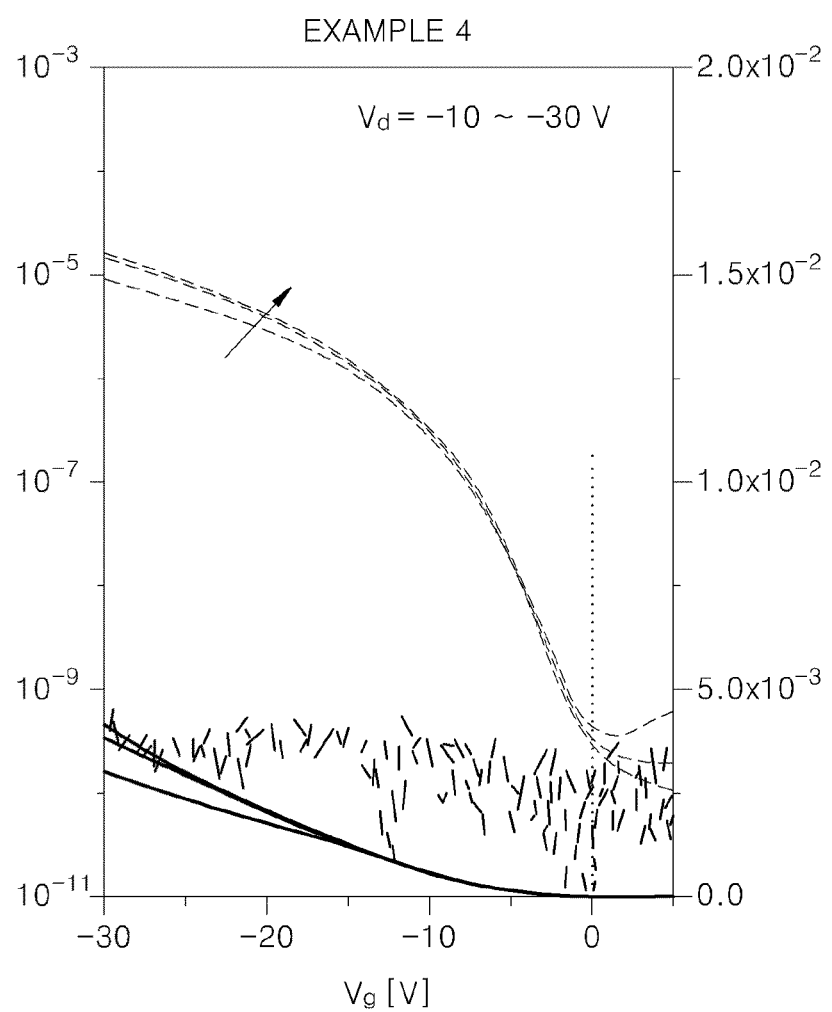

Atomic force microscopy (AFM) images were taken to confirm surface statuses of the organic insulating layers prepared in Examples 1 to 3 and Comparative Examples 1 and 2, and the images are shown in FIGS. 4A to 4E. FIG. 4F illustrates measurements of surface variables.

Referring to FIGS. 4A to 4E and 4F, the surface images of the organic insulating layers prepared in Examples 1 to 3 confirmed that a degree of surface roughness changes according to a mixing volume ratio of P(VDF-TrFE) and PMMA. Particularly, it may be confirmed that a uniform film with a low surface roughness was formed as a mixing ratio of P(VDF-TrFE) over PMMA increases. On the other hand, the organic insulating layer prepared in Comparative Example 1 only contains PMMA, and thus a film with a low surface roughness was formed due to amorphous characteristics of PMMA. Also, the organic insulating layer prepared in Comparative Example 2 only contains P(VDF-TrFE), and thus a film with a high surface roughness was formed due to crystalline characteristics of P(VDF-TrFE).

Drain voltages ($V_d$) 10 V, 20 V, and 30 V were each applied to the P(NDI2OD-T2) OTFTs prepared in Examples 1 to 3 and Comparative Example 1 to measure electrical characteristics of the P(NDI2OD-T2) OTFTs, and the transition curves are shown in FIGS. 5A to 5D.

Referring to FIGS. 5A to 5D, the P(NDI2OD-T2) OTFTs prepared in Examples 1 to 3 have an organic insulating layer, in which P(VDF-TrFE) and PMMA are mixed (hereinafter, referred to as "a P(VDF-TrFE)-PMMA mixed organic insulating layer"), and a decrease in a charge mobility of the n-type organic semiconductor layer due to a dipole moment that is induced by P(VDF-TrFE) as the content of P(VDF-TrFE) among components of the organic insulating layer increased was observed. The OTFT prepared in Example 2 (when a volume ratio of P(VDF-TrFE):PMMA was 7:3) was observed to have similar characteristics with the OTFT prepared in Comparative Example 1 (when P(VDF-TrFE) was used alone), and thus it may be confirmed that an OTFT having bipolarity may be prepared by applying the organic insulating layer composition with a volume ratio of 7:3 for P(VDF-TrFE):PMMA as a common organic insulating layer of the n-type OTFT prepared in Example 2 and the p-type OTFT prepared in Example 5.

Drain voltages ($V_d$) –10 V, –20 V, and –30 V were each applied to the PC12TV12T OTFTs prepared in Examples 4 to 6 and Comparative Example 3 to measure electrical characteristics of the PC12TV12T OTFTs, and the transition curves are shown in FIGS. 6A to 6D.

Referring to FIGS. 6A to 6D, the PC12TV12T OTFTs prepared in Examples 4 to 6 have the P(VDF-TrFE)-PMMA mixed organic insulating layer, and a gradual increase in an on-current ($I_{on}$) at the same Vds as a hole accumulation of the organic semiconductor layer, which is located at a channel area of the OTFT, increases due to a dipole moment that is induced by P(VDF-TrFE) as the content of P(VDF-TrFE) among components of the organic insulating layer increased was observed. However, according to a transition curve of the PC12TV12T OTFT prepared in Comparative Example 3, $I_{on}$ of when the same $V_d$ was applied was measured to be at a level of $10^{-5}$ A, and thus the $I_{on}$ of the PC12TV12T OTFT prepared in Comparative Example 3 was lower than the $I_{on}$ of the PC12TV12T OTFTs prepared in Examples 4 to 6.

Figure 7:
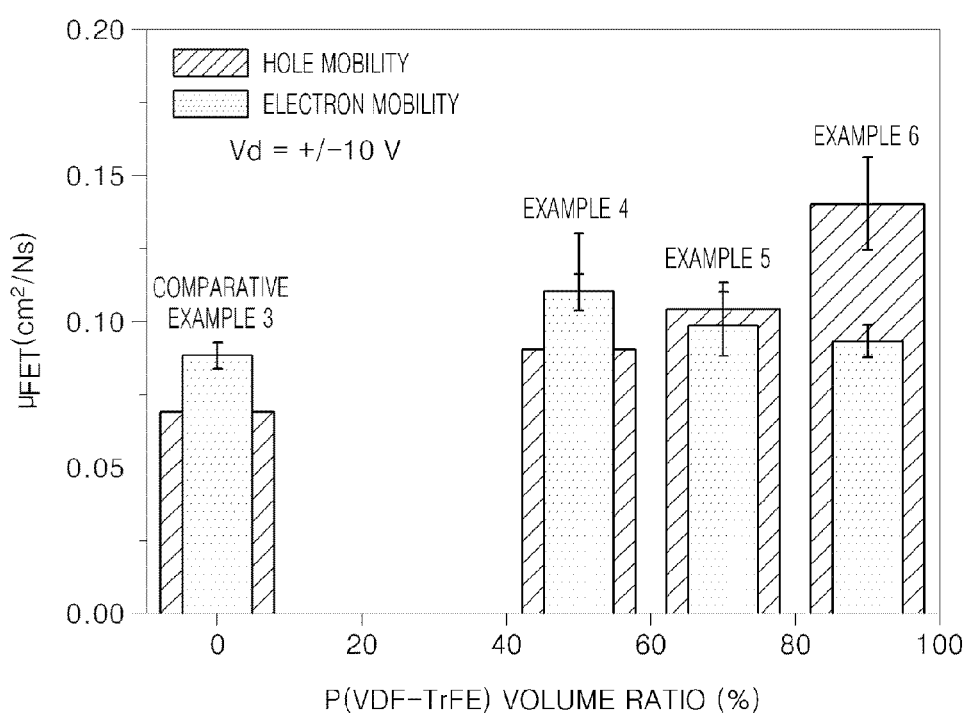
FIG. 7 illustrates a graph showing field effective mobilities ($\mu_{FET}$s) of the PC12TV12T OTFTs prepared in Examples 4 to 6 and Comparative Example 3.

Field effective mobilities ($\mu_{FET}$s) of the PC12TV12T OTFTs prepared in Examples 4 to 6 and Comparative Example 3 were measured, and the results are shown in FIG. 7.

Referring to FIG. 7, the field effective mobilities of the PC12TV12T OTFTs prepared in Examples 4 to 6 confirmed that hole mobility is significantly increased as the content of P(VDF-TrFE) among components of the P(VDF-TrFE)-PMMA mixed organic insulating layer increased. Without being bound by theory, it is believed that the significant increase in the hole mobility is caused by the number of holes formed in the PC12TV12T organic semiconductor film due to a dipole moment induced by P(VDF-TrFE) as the content of P(VDF-TrFE) among components of the P(VDF-TrFE)-PMMA mixed organic insulating layer increased. However, the PC12TV12T OTFT prepared in Comparative Example 3, including the organic insulating layer using PMMA alone, had a relatively low hole mobility.

Figure 8:
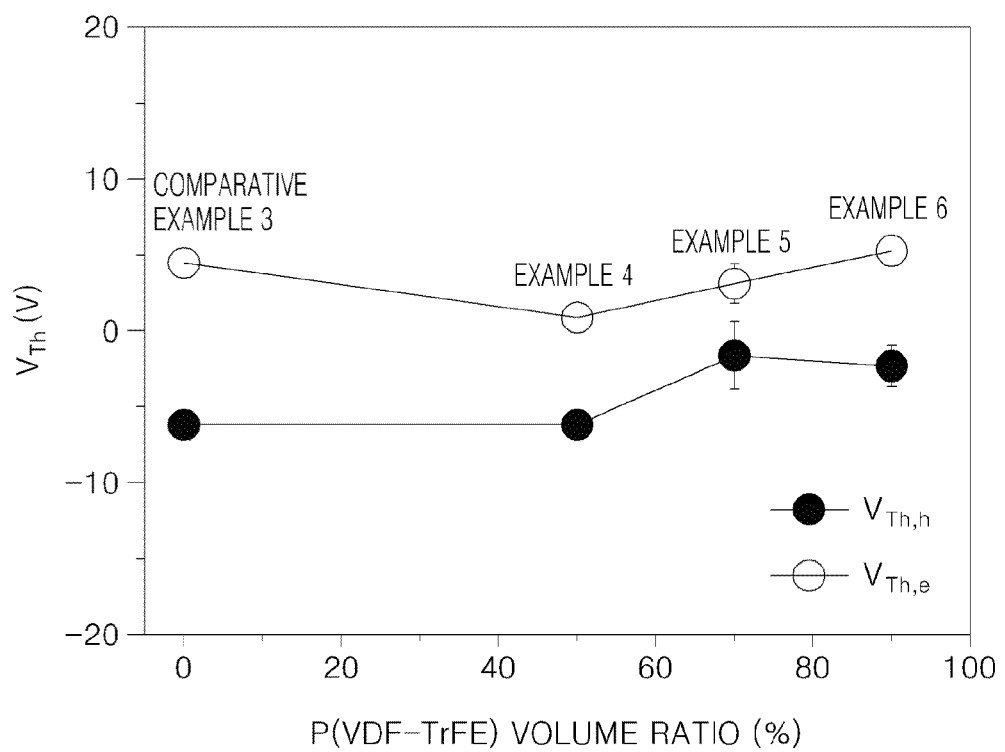
FIG. 8 illustrates a graph showing threshold voltages ($V_{Th}$s) of the PC12TV12T OTFT prepared in Examples 4 to 6 and Comparative Example 3.

Threshold voltages ($V_{Th}$s) of the PC12TV12T OTFTs prepared in Examples 4 to 6 and Comparative Example 3 were measured, and the results are shown in FIG. 8.

Referring to FIG. 8, threshold voltages of the PC12TV12T OTFTs prepared in Examples 4 to 6 (when the P(VDF-TrFE)-PMMA mixed organic insulating layer was used) were observed to not significantly change regardless of the content of P(VDF-TrFE) among components of the organic insulating layer. As a result, the threshold voltages of the PC12TV12T OTFTs prepared in Examples 4 to 6 and a threshold voltage of the PC12TV12T OTFT prepared in Comparative Example 3 were observed as not significantly different.

Output voltage of the ring oscillators prepared in Examples 4 to 6 and Comparative Example 3 were measured, and the results are shown in FIG. 9.

Referring to FIG. 9, it may be confirmed that driving rates of the ring oscillators prepared in Examples 4 to 6 were increased by values of the output voltages that are applied to the ring oscillators prepared in Examples 4 to 6. Such tendency agrees with a theory of a driving rate proportionally increasing with respect to an output voltage.

Figure 10:
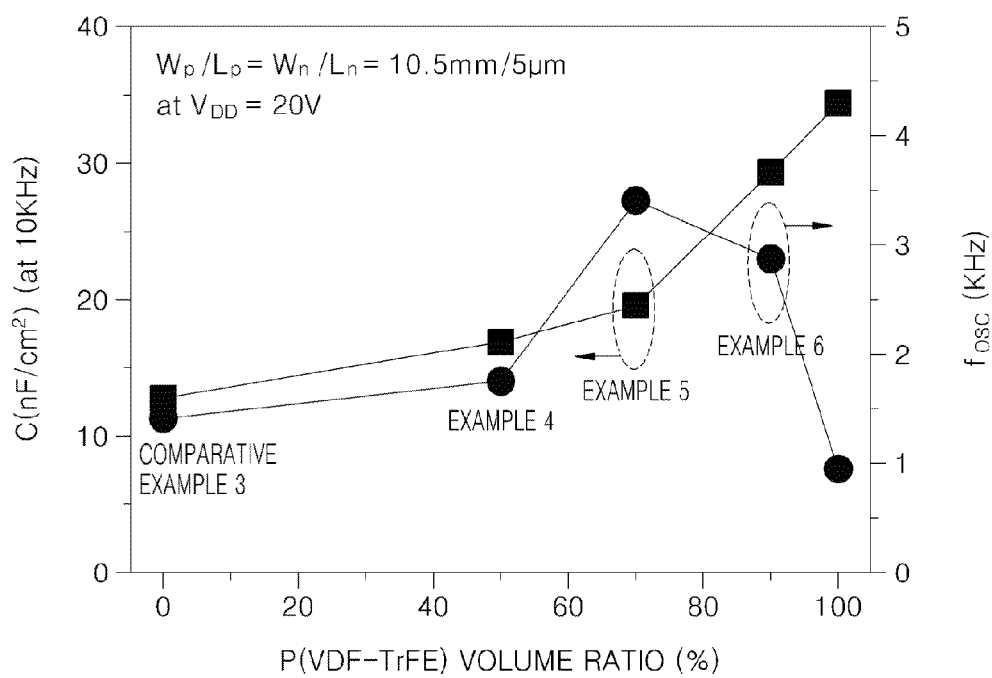
FIG. 10 illustrates a graph showing capacitances (Cs) of the ring oscillators prepared in Examples 4 to 6 and Comparative Example 3.

Capacitances of the ring oscillators prepared in Examples 4 to 6 and Comparative Example 3 were measured, and the results are shown in FIG. 10.

Referring to FIG. 10, the capacitances of the ring oscillators prepared in Examples 4 to 6 were observed to have higher values when the content of P(VDF-TrFE) increased in the P(VDF-TrFE)-PMMA mixed organic insulating layer, and ultimately, when the content of P(VDF-TrFE) is 100%, a value of the capacitance was observed to be the highest. Operation frequencies ($f_{OSC}$s), which are driving rates of the ring oscillators, increase as the content of P(VDF-TrFE) increases when the P(VDF-TrFE)-PMMA mixed organic insulating layer is used. When the content of P(VDF-TrFE) is 70% or greater, hole mobility may continuously increase, but electron mobility may significantly decrease, and thus the p-type OTFT and n-type OTFT may not have a balanced mobility. When P(VDF-TrFE) and PMMA are mixed at a mixing ratio of 70:30, the p-type OTFT and n-type OTFT may have similar mobilities, and thus the fastest driving rates for the ring oscillators may be obtained.

Performances of the OTFTs prepared in Examples 1 to 6 and Comparative Examples 1 and 3 are shown in Table 1 below.

TABLE 1

| (P(VDF-TrFE):PMMA | TFT type | $V_d = \pm 10$ V | | | $V_d = \pm 30$ V | | |
|---|---|---|---|---|---|---|---|
| | | Mobility | $V_{Th}$ | $I_{on}/I_{off}$ | Mobility | VTh | $I_{on}/I_{off}$ |
| Ex. 1 (5:5) | n-type | $\mu_{FETe} = 0.11$ | 0.90 | ~$10^4$ | $\mu_{FETe} = 0.26$ | 5.15 | ~$10^3$ |
| Ex. 2 (7:3) | n-type | $\mu_{FETe} = 0.010$ | 3.25 | ~$10^4$ | $\mu_{FETe} = 0.23$ | 5.67 | ~$10^3$ |
| Ex. 3 (9:1) | n-type | $\mu_{FETe} = 0.093$ | 5.37 | ~$5 \times 10^4$ | $\mu_{FETe} = 0.27$ | 10.30 | ~$10^3$ |
| Comp. Ex. 1 (0:10) | n-type | $\mu_{FETe} = 0.088$ | 4.43 | ~$5 \times 10^4$ | $\mu_{FETe} = 0.22$ | 6.80 | ~$10^5$ |
| Ex. 4 (5:5) | p-type | $\mu_{FETh} = 0.091$ | −6.35 | ~$5 \times 10^5$ | $\mu_{FETh} = 0.29$ | −10.75 | ~$10^3$ |
| Ex. 5 (7:3) | P-type | $\mu_{FETh} = 0.105$ | −1.50 | ~$5 \times 10^5$ | $\mu_{FETh} = 0.33$ | −6.50 | ~$5 \times 10^5$ |
| Ex. 6 (9:1) | p-type | $\mu_{FETh} = 0.14$ | −2.34 | ~$10^6$ | $\mu_{FETh} = 0.45$ | −5.90 | ~$5 \times 10^4$ |
| Comp. Ex. 3 (0:10) | p-type | $\mu_{FETh} = 0.069$ | −6.17 | ~$10^5$ | $\mu_{FETh} = 0.25$ | −12.74 | ~$10^6$ |

By way of summation and review, once a solution process and a roll-to-roll process are enabled, a flexible display may be manufactured at a relatively low cost. In this regard, a bendable substrate, such as plastic or stainless steel, may be considered, and a process temperature may be 300° C. or less. Research has been actively performed in recent years on an organic thin film transistor (OTFT), as a transistor for a driving circuit, which may be manufactured at such low temperature.

OTFTs may be applied in driving devices for the next generation flexible displays, and thus recent studies on OTFTs have been actively conducted, and OTFTs are expected to be applied to the manufacture of radio frequency identification (RFID) tags for individual item unit identification. An OTFT uses organic semiconductor, instead of silicon, as a semiconductor layer, and, depending on a molecular weight of a material included in an organic layer of the OTFT, the OTFT may be a low molecular-weight OTFT or a high molecular-weight OTFT.

OTFTs may have a relatively low mobility compared to conventional polycrystalline or monocrystalline silicon transistors including a silicon thin film. Thus, current applications of the OTFTs are limited. Thus, in order to expand the application fields by improving the performance of the OTFTs, it is desired to develop an organic semiconductor material, controlling an interface between an organic semiconductor and an insulator, and improving injection ability of charges through an electrode. Particularly, since charge carriers, such as electrons or holes, move at the interface between a semiconductor layer and an insulating layer, the control of the semiconductor layer-insulating layer interface affects improving charge mobility, and the performance of the OTFTs may be improved by controlling the interface characteristics.

As described above, embodiments relate to an organic insulating layer composition including a polymer mixture, in which an organic polymer with a large dipole moment and an amorphous polymer are mixed, a method of forming an organic insulating layer by using the organic insulating layer composition, and an OTFT including the organic insulating layer formed by using the method of forming the organic insulating layer.

According to an embodiment, an organic insulating layer composition according to an embodiment may form an organic insulating layer with a stable performance as the organic insulating layer composition includes a mixture of an organic polymer having a high dipole moment and an amorphous polymer to effectively suppress ferroelectricity. Hole mobility of the organic insulating layer may be significantly increased as holes easily accumulate at an interface between the organic insulating layer, which includes the mixture of the organic polymer having a high dipole moment and the amorphous polymer, and an organic semiconductor layer.

Also, according to another embodiment, the electrical performance of an OTFT may be significantly improved by including the organic insulating layer, and when the organic insulating layer is applied to a p-type OTFT, the accumulation of electrons may not be obstructed, and thus a decrease in electron mobility may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic insulating layer composition, comprising:
a polymer mixture including 50 parts to 90 parts by volume of an organic polymer and 10 parts to 50 parts by volume of an amorphous polymer, wherein the organic polymer includes at least a first repeating unit and a second repeating unit, the first and second repeating units each being substituted with at least one of fluorine or chlorine, a total number of fluorine and chlorine atoms in the first repeating unit being different from a total number of fluorine and chlorine atoms in the second repeating unit; and
an organic solvent.

2. The organic insulating layer composition as claimed in claim 1, wherein the organic polymer includes at least one selected from poly(vinylidene fluoride-trifluoroethylene), poly(vinylidene fluoride-trifluoroethylene-chlorofluoroethylene), poly(vinylidene fluoride-trifluoroethylene-chlorodifluoroethylene), poly(vinylidene fluoride-trifluoroethylene-chlorotrifluoroethylene), and poly(vinylidene fluoride-trifluoroethylene-hexafluoropropylene).

3. The organic insulating layer composition as claimed in claim 1, wherein a number average molecular weight of the organic polymer is 5,000 to 1,000,000.

4. The organic insulating layer composition as claimed in claim 1, wherein the organic polymer is poly(vinylidene fluoride-trifluoroethylene).

5. The organic insulating layer composition as claimed in claim 4, wherein a polymer weight ratio of vinylidene fluoride and trifluoroethylene of the organic polymer is 55:45 to 95:5.

6. The organic insulating layer composition as claimed in claim 1, wherein the amorphous polymer includes at least one selected from polymethyl methacrylate, polystyrene, polyvinylpyrrolidone, and polyimide.

7. The organic insulating layer composition as claimed in claim 1, wherein a number average molecular weight of the amorphous polymer is 10,000 to 1,000,000.

8. The organic insulating layer composition as claimed in claim 1, wherein the organic solvent includes at least one selected from dimethyl sulfoxide, methyl ethyl ketone, acetonitrile, and 1-butanone.

9. A method of forming an organic insulating layer, the method comprising:
coating a top of an organic semiconductor layer or a gate electrode with the organic insulating layer composition as claimed in claim 1 to form a coating layer; and
heat-treating the coating layer formed by the coating.

10. The method as claimed in claim 9, wherein the coating is performed by using a spin coating method, a deep coating method, a printing method, or an inkjet or roll coating method.

11. The method as claimed in claim 9, wherein the heat-treating is performed at a temperature of 150° C. or less.

12. The method as claimed in claim 9, wherein the coating is performed by using a spin coating method, and the heat-treating is performed at a temperature of 70° C. to 100° C. for 1 to 3 hours.

13. The method as claimed in claim 9, wherein the coating includes:

coating the top of the organic semiconductor layer with a first organic insulating layer composition to prepare a coating layer;

removing a portion of the coating layer from a top of a p-type organic semiconductor layer; and coating the top of the p-type organic semiconductor layer with a second organic insulating layer composition, wherein the second organic insulating layer composition is the organic insulating layer composition as claimed in claim 1.

14. The method as claimed in claim 13, wherein the removing of the portion of the coating layer is performed by using an inkjet printing method of a solvent.

15. An organic insulating layer formed by using the method as claimed in claim 9.

16. The organic insulating layer as claimed in claim 15, wherein a thickness of the organic insulating layer is 100 nm to 400 nm.

17. An organic thin film transistor (OTFT), comprising:
a substrate;
source/drain electrodes;
an organic semiconductor layer;
the organic insulating layer as claimed in claim 15; and
a gate electrode.

18. The OTFT as claimed in claim 17, wherein the substrate includes at least one selected from glass, silicon, polyethersulphone, polyacrylate, polyetherimide, polyethylene naphthalate, polyethylene terephthalate, polyphenylene sulfide, polyallylate, polyimide, polycarbonate, cellulose triacetate, cellulose acetate propionate, and a metal foil.

19. The OTFT as claimed in claim 17, wherein the source/drain electrodes include at least one selected from gold, silver, molybdenum, copper, and indium tin oxide.

20. The OTFT as claimed in claim 17, wherein the organic semiconductor layer includes at least one selected from polythiophene, thienothiophene, triisopropylsilyl pentacene, pentacene precursor, alpha-6-thiophene, polyfluorene, pentacene, tetracene, anthracene, perylene, rubrene, coronene, perylene tetracarboxylic diimide, polyparaphenylene vinylene, polythiophene vinylene, polythienylenevinylene, oligothiophene of alpha-5-thiophene, benzothieno[3,2-b]benzothiophene, poly {[N,N'-bis(2-octyldodecyl)-naphthalene-1,4,5,8-bis(dicarboximide)-2,6-diyl]-alt-5,5'-(2,2'-bithiophene)}, alkyl-substituted polythienylenevinylene and dodecylthiophene, phthalocyanine with or without metal, naphthalene tetra carboxylic acid diimide, and their derivatives.

21. The OTFT as claimed in claim 17, wherein the gate electrode includes at least one selected from gold, nickel, copper, silver, aluminum, molybdenum, an aluminum alloy, a molybdenum alloy, and a polyethylenedioxythiophene/polystyrenesulfonate mixture.

22. The OTFT as claimed in claim 17, wherein the OTFT is a top gate type, a bottom gate type, a top contact type, or a bottom contact type.

23. The OTFT as claimed in claim 17, wherein the OTFT is a p-type OTFT.

24. The OTFT as claimed in claim 17, wherein the OTFT is an ambipolar OTFT.

25. An organic light-emitting display apparatus comprising the OTFT as claimed in claim 17.

* * * * *